US006851079B1

(12) United States Patent
Hergott

(10) Patent No.: US 6,851,079 B1
(45) Date of Patent: Feb. 1, 2005

(54) JTAG TEST ACCESS PORT CONTROLLER USED TO CONTROL INPUT/OUTPUT PAD FUNCTIONALITY

(75) Inventor: Michael A. Hergott, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 505 days.

(21) Appl. No.: 09/821,226

(22) Filed: Mar. 28, 2001

(51) Int. Cl.[7] .............................................. G01R 31/28
(52) U.S. Cl. ...................................................... 714/724
(58) Field of Search ................................ 714/724, 726, 714/727, 729, 733, 734

(56) References Cited

U.S. PATENT DOCUMENTS

| | | | | |
|---|---|---|---|---|
| 4,335,457 A | * | 6/1982 | Early ........................... 714/745 |
| 5,513,186 A | * | 4/1996 | Levitt .......................... 714/727 |
| 6,125,464 A | * | 9/2000 | Jin .............................. 714/727 |
| 6,418,545 B1 | * | 7/2002 | Adusumilli .................. 714/729 |
| 6,427,216 B1 | * | 7/2002 | El-Kik et al. ................ 714/726 |
| 6,446,230 B1 | * | 9/2002 | Chung ......................... 714/726 |
| 6,536,008 B1 | * | 3/2003 | Nadeau-Dostie et al. ... 714/726 |
| 6,587,979 B1 | * | 7/2003 | Kraus et al. ................. 714/720 |

* cited by examiner

Primary Examiner—A. Decady
Assistant Examiner—Cynthia Britt
(74) Attorney, Agent, or Firm—Christopher P. Maiorana, P.C.

(57) ABSTRACT

A circuit that may be used to implement boundary scan testing. The circuit generally comprises a pad circuit, a core logic, a cell, and a test circuit. The pad circuit may be configured to transfer a data signal in response to a pad control signal. The core logic may be configured to (i) exchange the data signal with the pad circuit and (ii) present a control signal. The cell may be configured to (i) transfer the data signal between the pad circuit and the core logic and (ii) swap the data signal and a test signal. The test circuit may-be configured to (i) exchange the test data signal with the cell, (ii) store a test control signal, and (iii) multiplex the test control signal and the control signal to present the pad control signal.

20 Claims, 5 Drawing Sheets

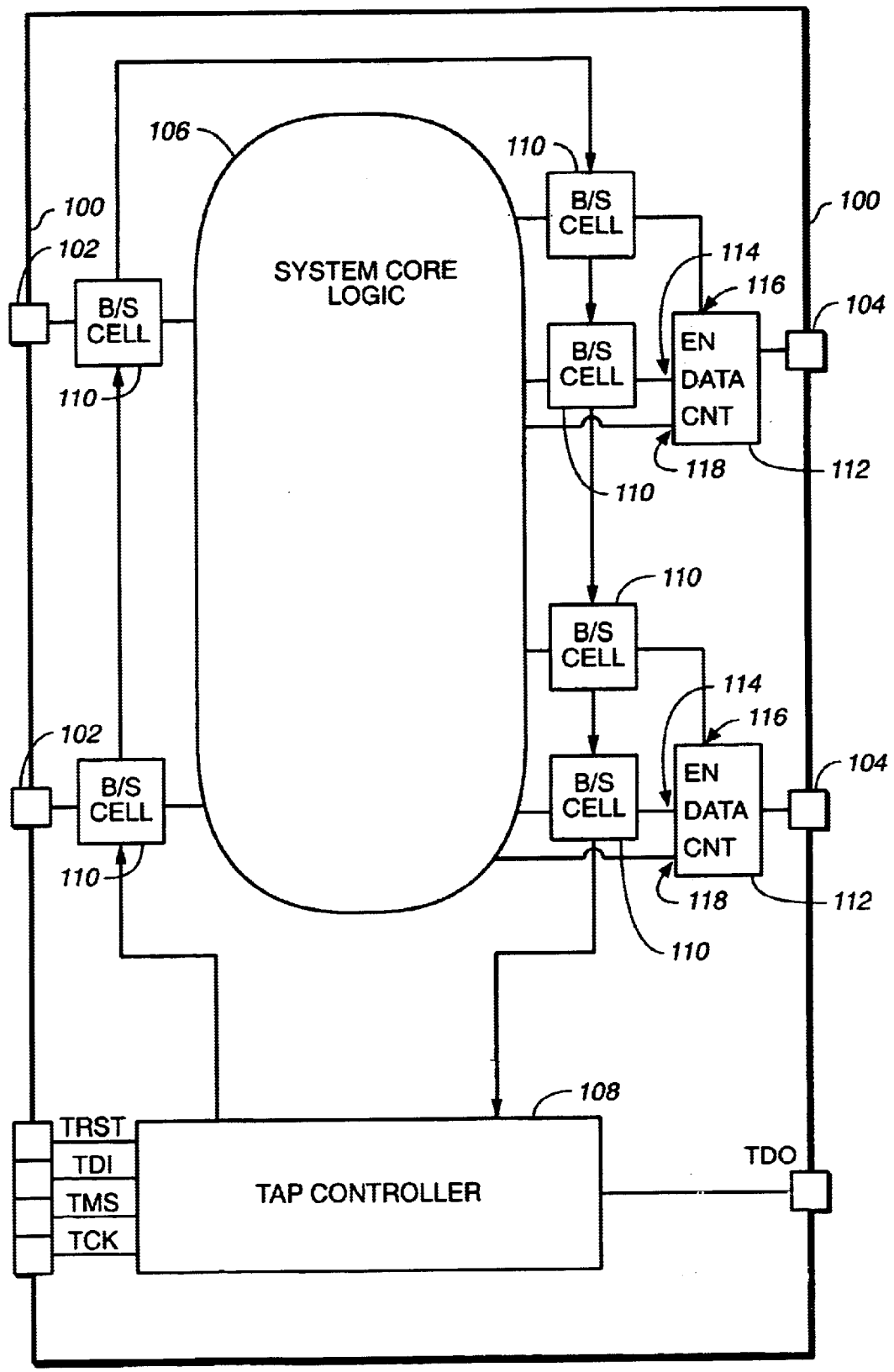
FIG._1
*(CONVENTIONAL)*

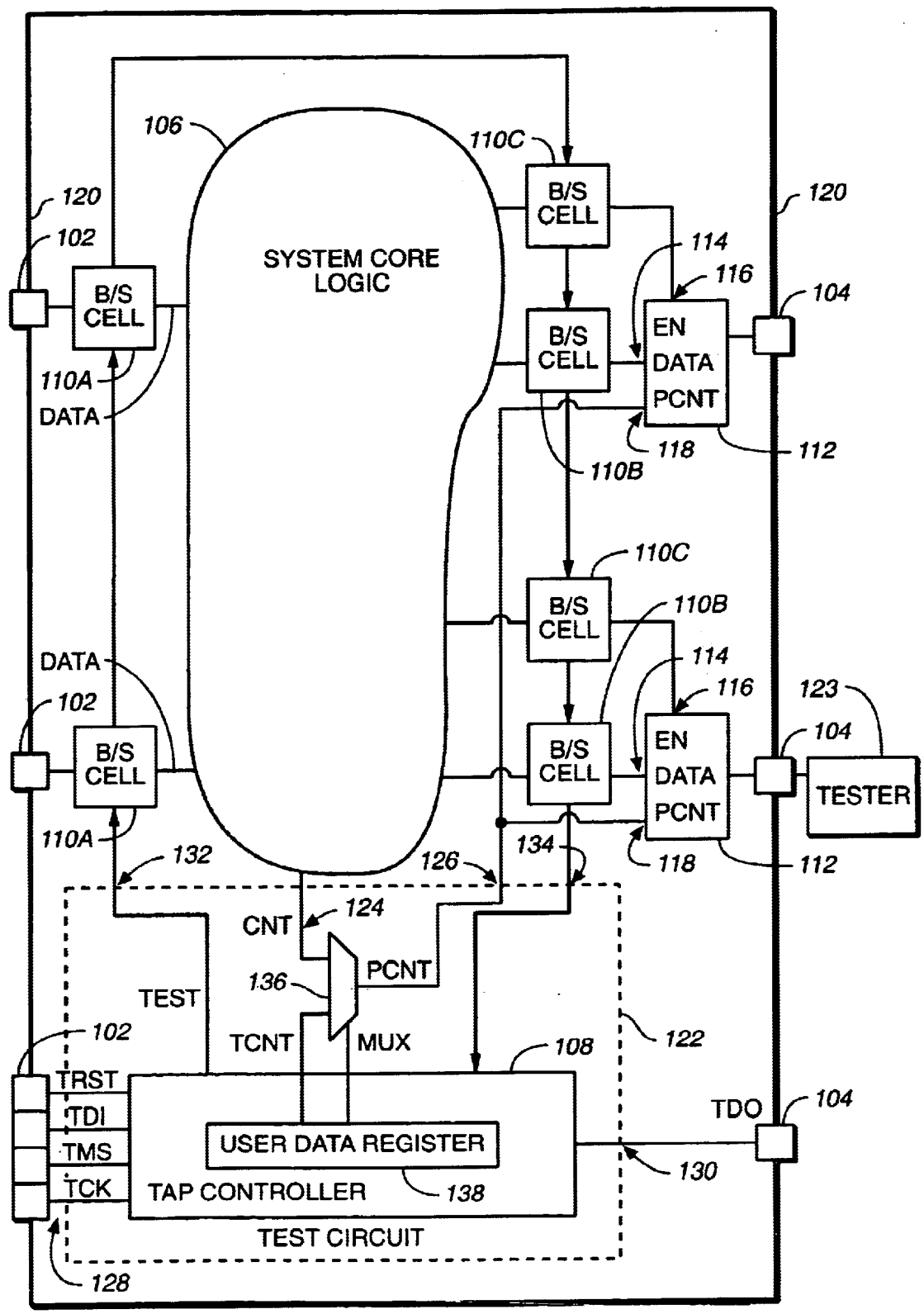
FIG._2

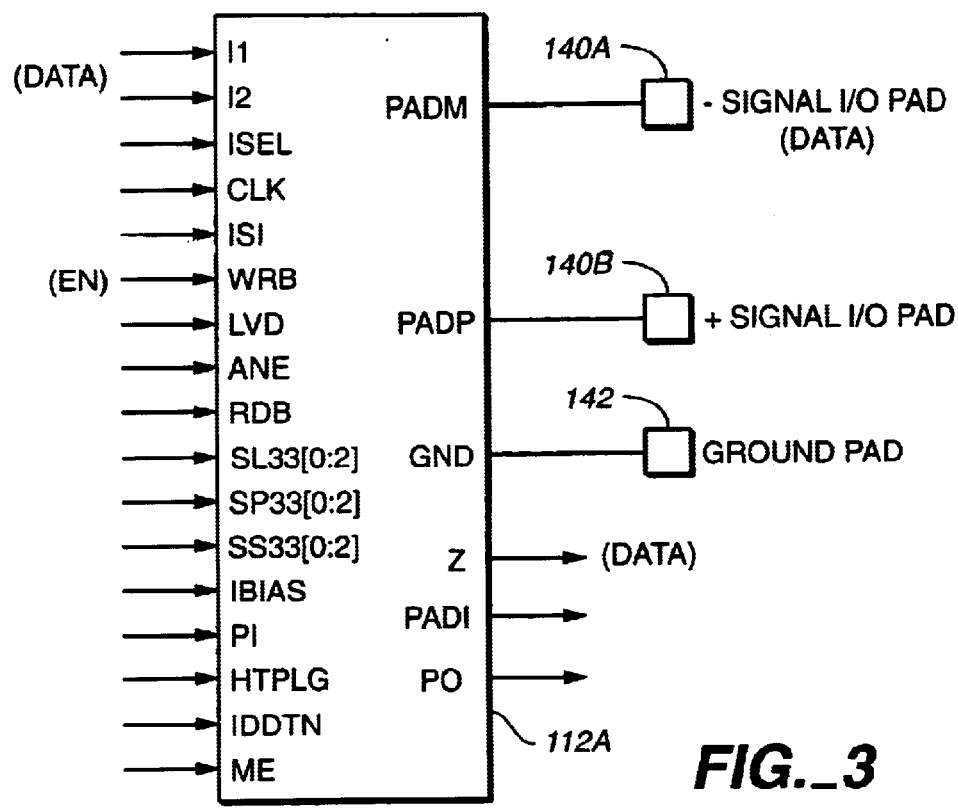
FIG._3
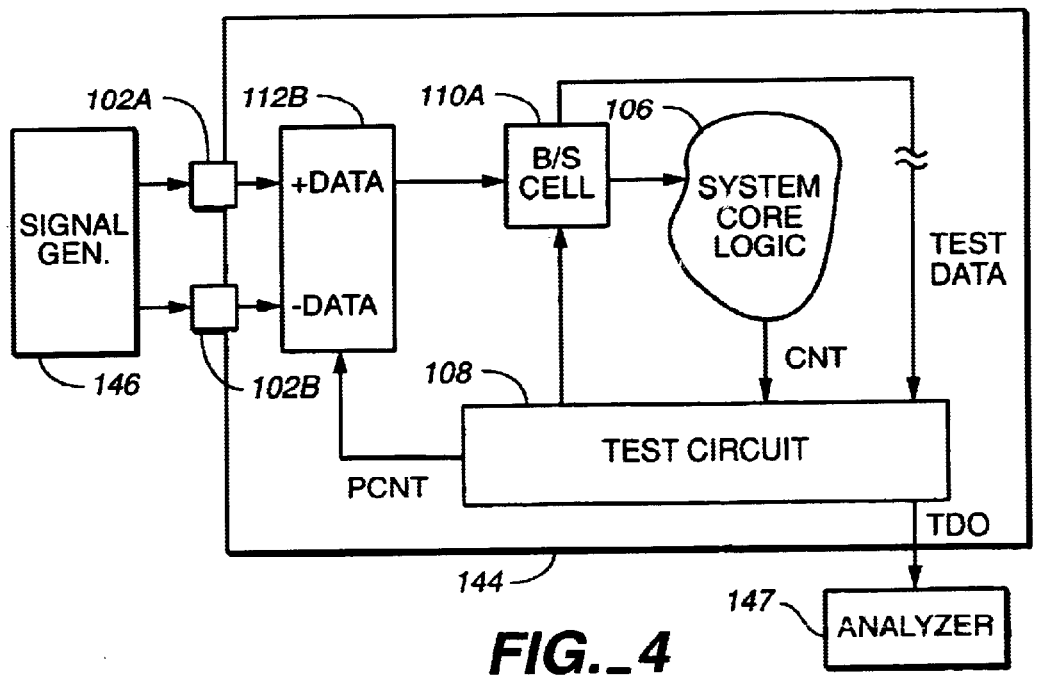
FIG._4

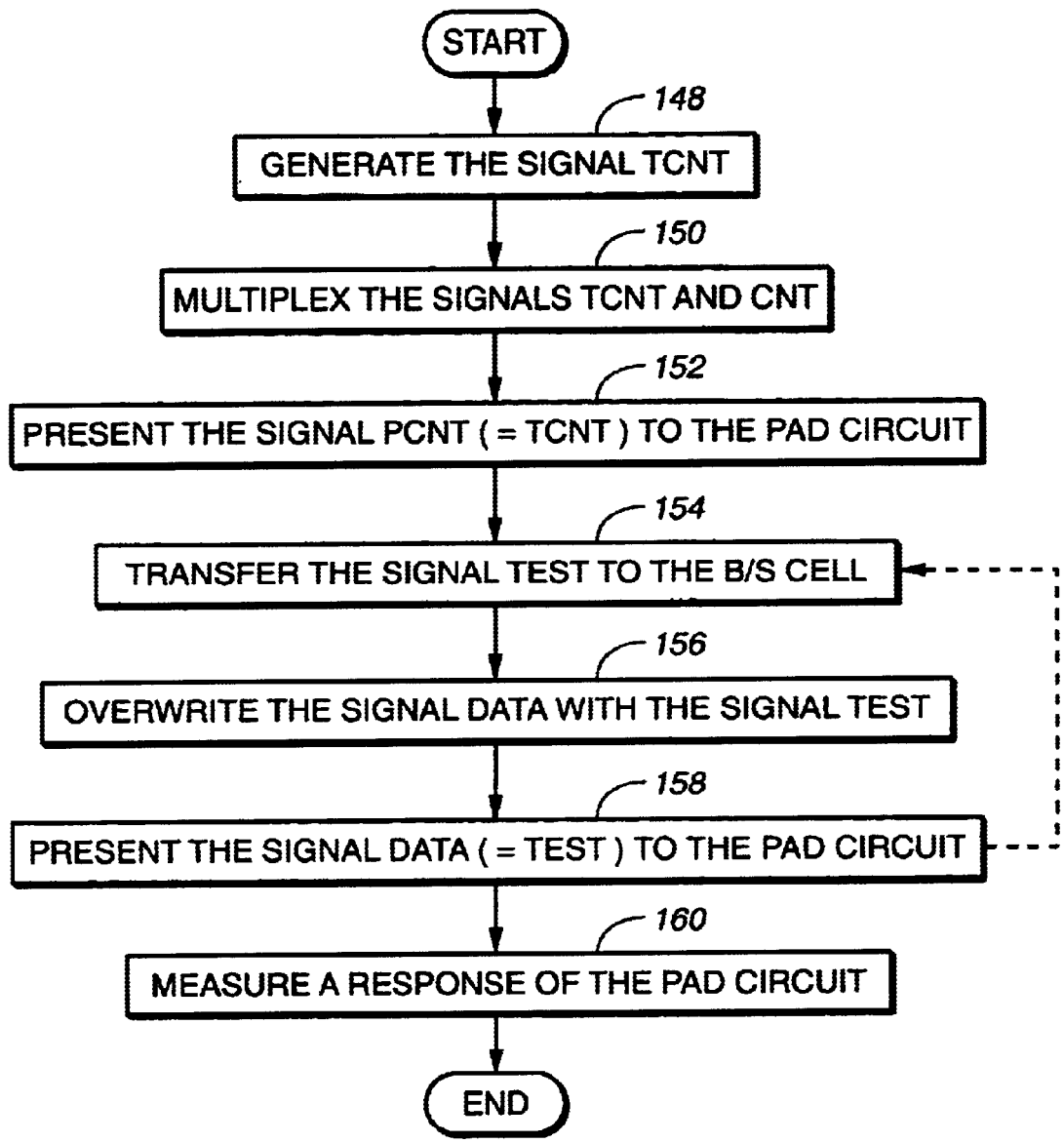
FIG._5

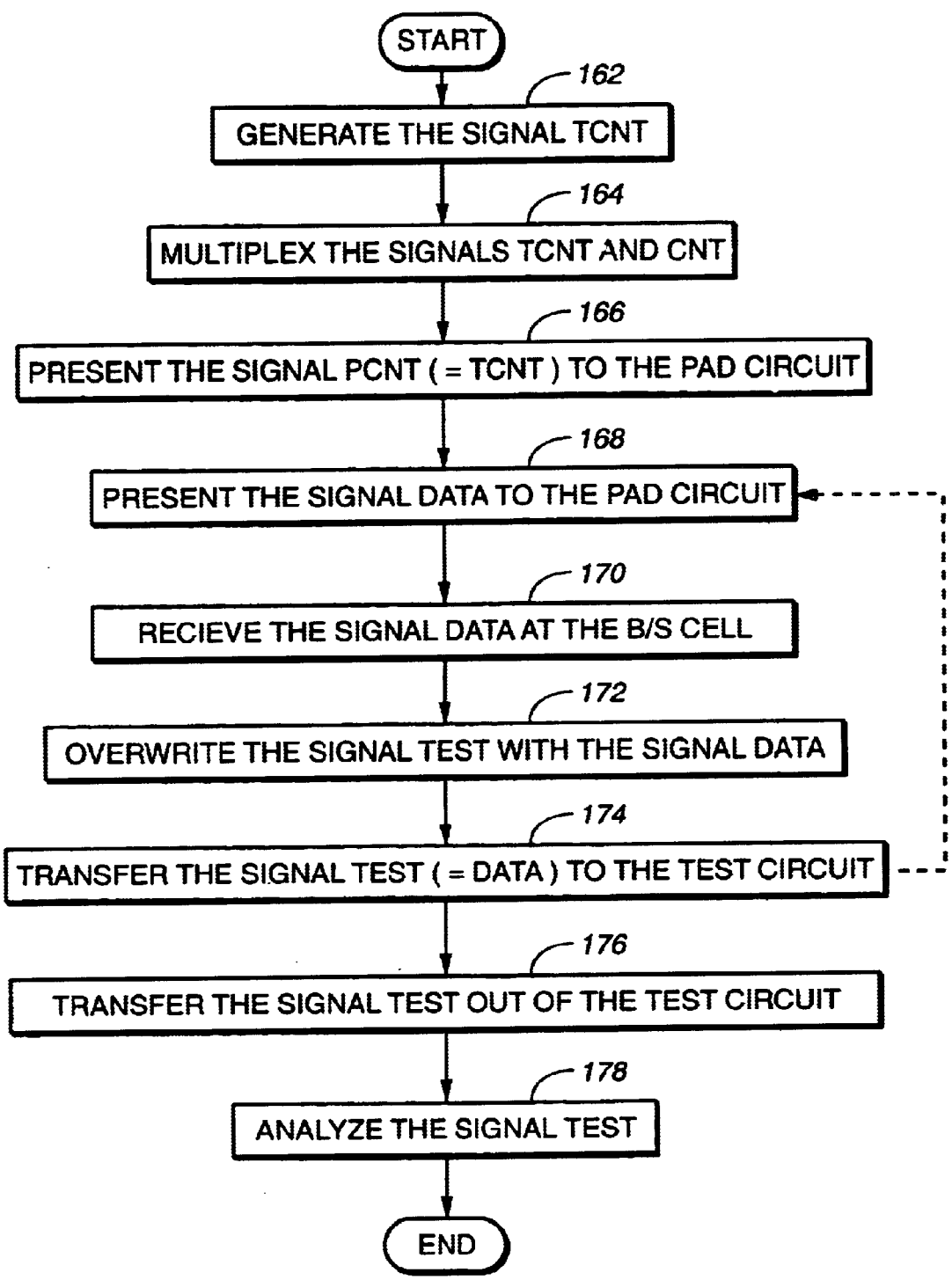
FIG._6

JTAG TEST ACCESS PORT CONTROLLER USED TO CONTROL INPUT/OUTPUT PAD FUNCTIONALITY

FIELD OF THE INVENTION

The present invention relates to a method and/or architecture for boundary scan testing generally and, more particularly, to testing input/output pad circuit functionality.

BACKGROUND OF THE INVENTION

Referring to FIG. 1, a typical pad-level (input/output) block diagram of an integrated circuit 100 is shown. The integrated circuit 100 includes system input pins 102, system output pins 104, a system core logic 106, an IEEE Standard Test Access Port (TAP) controller 108, and boundary-scan (B/S) cells 110. Multiple pad circuits 112 are disposed between the B/S cells 110 and the output pins 104. Each pad circuit 112 has an input 114 for a data signal (i.e., DATA), an input 116 for an enable signal (i.e., EN), and another input 118 for one or more control signals (i.e., CNT).

The signals CNT control the configurable behavior of the output pad 112. Examples of the configurable behavior include drive strength, slew rate, and mode selections. The signals CNT are not required on simple pad circuits 112. The signals CNT are driven only by the system core logic 106. Here, a boundary scan test of the pad circuits 112 requires use of the system core logic 106 to set or default the signals CNT into a desired state. In many circumstances, configuring the system control logic 106 to present the signals CNT in the desired state requires a complicated sequence of events at the system input pins 102 and/or associated B/S cells 110.

SUMMARY OF THE INVENTION

The present invention concerns a circuit that may be used to implement boundary scan testing. The circuit generally comprises a pad circuit, a core logic, a cell, and a test circuit. The pad circuit may be configured to transfer a data signal in response to a pad control signal. The core logic may be configured to (i) exchange the data signal with the pad circuit and (ii) present a control signal. The cell may be configured to (i) transfer the data signal between the pad circuit and the core logic and (ii) swap the data signal and a test signal. The test circuit may be configured to (i) exchange the test data signal with the cell, (ii) store a test control signal, and (iii) multiplex the test control signal and the control signal to present the pad control signal.

The objects, features and advantages of the present invention include providing a method and/or architecture for boundary scan testing generally and, more particularly, to boundary scan testing of pad circuits that may provide (i) simple programming of a behavior of the pad circuits, (ii) short test setup times, and/or (iii) minimal additional hardware.

BRIEF DESCRIPTION OF THE DRAWINGS

These and other objects, features and advantages of the present invention will be apparent from the following detailed description and the appended claims and drawings in which:

FIG. 1 is a block diagram of an integrated circuit having a boundary scan architecture;

FIG. 2 is a block diagram of a circuit implementing the present invention;

FIG. 3 is a block diagram of a bidirectional type of pad circuit;

FIG. 4 is a block diagram of a portion of another embodiment of the circuit shown in FIG. 1;

FIG. 5 is a flow diagram of a procedure for testing an output type pad circuit; and FIG. 6 is a flow diagram of a procedure for testing an input type pad circuit.

DETAILED DESCRIPTION OF THE PREFERRED EMBODIMENTS

Referring to FIG. 2, a block diagram of a circuit 120 is shown in accordance with a preferred embodiment of the present invention. The circuit 120 generally comprises the system input pins 102, the system output pins 104, the system core logic 106, the boundary scan (B/S) cells 110, the pad circuits 112, and a circuit 122. The circuit 122 may serve as a test circuit 122 that generally controls boundary scan testing. A tester 123 external to the circuit 120 may be connected to the system output pins 104 to measure a response of the pad circuits 112.

Each system input pin 102 may present the signal DATA to an associated B/S cell 110A. Each B/S cell 110A may present the signal DATA to the system core logic 106. The system core logic 106 may present the signals DATA to the B/S cells 110B connected to the pad circuits 112. Each B/S cell 110B may present the signal DATA to the input 114 of an associated pad circuit 112. Each pad circuit 112 may present the signal DATA to an associated system output pin 104. In other words, the signals DATA may be exchanged among the system input and output pins 102 and 104, the system core logic 106, the B/S cells 110, and the pad cells 112. The system core logic 106 may also present the signals EN to the B/S cells 110C. Each B/S cell 110C may present the signal EN to the input 116 of the associated pad circuit 112.

The system core logic 106 may present the signals CNT to an input 124 of the test circuit 122. The test circuit 122 may have an output 126 to present one or more signals (e.g., PCNT). Each signal PCNT may be received at the input 118 of the pad circuit 112. The test circuit 122 may have another input 128 for receiving several signals (e.g., TRST, TDI, TMS, and TCK). The test circuit 122 may have another output 130 for presenting a signal (e.g., TDO). Each signal TRST, TDI, TMS and TCK may be received by the circuit 120 through one of the system input pins 102. The signal TDO may be presented by the circuit 120 through one of the system output pins 104.

The test circuit 122 may have an output 132 for presenting a signal (e.g., TEST) to a first of the B/S cells 110. The B/S cells 110 may daisy-chain the signal TEST through all of the B/S cells 110. A last of the B/S cells 110 in the daisy-chain may present the signal TEST to an input 134 of the test circuit 122. By way of the output 132 and the input 134, the test circuit 122 may exchange the signal TEST with the B/S cells 110.

Each signal DATA may serve as data information input and/or output from the system core logic 106. Each signal EN may serve as an enable signal. The signals EN may instruct the pad circuits 112 to either tri-state or drive the signal DATA to the associated system output pin 104. Each signal CNT may serve as a control signal that sometimes programs the pad circuit 112. The signal PCNT may serve as a pad control signal that actually programs how the pad circuit 112 transfer the signal DATA. Under non-testing conditions the signal PCNT may be the signal CNT. Each signal TEST may serve as a test data signal. The signal TEST may be used to present data to the system core logic 106 and/or the pad circuits 112. The signal TEST may also be used to receive data from the system input pins 102 and/or the system core logic 106.

The test circuit 122 generally comprises the TAP controller 108 and a multiplexer 136. The TAP controller 108 may comply with the "IEEE Standard Test Access Port and Boundary Scan Architecture", document number 1149.1-1990, (Institute of Electrical and Electronics Engineering, New York, N.Y.) hereby incorporated by reference in its entirety. Other standards for test access ports and boundary scan architectures may be implemented by the present invention to meet the design criteria of a particular application. Although one multiplexer 136 is shown in FIG. 2, the present invention may include several multiplexers 136. Generally, there may be one multiplexer 136 for each distinct signal CNT presented by the system core logic 106.

The TAP controller 108 may receive the signals TRST, TDI, TMS, and TCK from the system input pins 102. The TAP controller 108 may present the signal TDO to one of the system output pins 104. The TAP controller 108 may present two signals (e.g., TCNT and MUX) to inputs of the multiplexer 136. The multiplexer 136 may have inputs for receiving the signals CNT from the system core logic 106. The multiplexer 136 may present the signal PCNT to the pad circuits 112.

The signals TCNT may serve as test control signals that sometimes program the pad circuits 112. Under test conditions, the signals PCNT may be the signals TCNT. Although one signal TCNT is shown in FIG. 2, the present invention may include several distinct signals TCNT. Generally, the signals TCNT may match the signals CNT one-to-one.

The multiplexer 136 generally selects the signals PCNT from between the signals CNT and the signals TCNT. The multiplexer 136 may use the signal MUX to control the selection. The multiplexer 136 may present either the signal CNT or the signal TCNT as the signal PCNT.

The TAP controller 108 may include a register 138. The register 138 may serve as a user data register 138. The user data register 138 may be a design-specific test data register in accordance with the IEEE 1149.1-1990 specification. The signals TCNT and MUX may be entered into the user data register 138 using the signals TDI, TCK, TMS and/or TRST. The user data register 138 may present the signals TCNT and MUX to the multiplexer 136.

Referring to FIG. 3, a block diagram of a bidirectional type of pad circuit 112A is shown in accordance with a preferred embodiment of the present invention. The pad circuit 112A may receive several signals (e.g., I1, I2, ISEL, CLK, ISI, WRB, LVD, ANE, RDB, SL33, SP33, SS33, IBIAS, PI, HTPLG, IDDTN, ME, PDAM, and PADP). The pad circuit 112A may present several signals (e.g., PADM, PADP, GND, Z, PADI, and PO). Any one or more of the signals ISEL, ISI, WRB, LVD, ANE, RDB, SL33, SP33, SS33, PI, HTPLG, IDDTN, ME, and EN (from FIG. 2) may serve as the signal PCNT from FIG. 2.

The signals I1 and I2 may serve as data input signals from the B/S cells 110. In particular, the signals I1 and/or I2 together or individually may serve as the signal DATA received by the pad circuit 112 of FIG. 2. The signals I1 and I2 may have a logical HIGH state when negated and a logical LOW state when asserted. The signal I1 may serve as a primary data signal. The signal I1 may be presented directly to an output or latched by the pad circuit 112A. The signal I2 may serve as a secondary signal having a coded value for inter-symbol interference compensation.

The signals ISEL may serve as an input select line. The signal ISEL may control which of the input signals feeds an internal driver (not shown). The signal ISEL may be in the logical HIGH state to cause the signal I1 may be latched. The signal ISEL may be in the logical LOW state to cause the signal I1 to be presented directly to the internal driver.

The signal CLK may serve as a clock input signal. The signal CLK may be used for latching and synchronizing the signal I1. In a preferred embodiment, a rising edge of the signal CLK triggers latching.

The signal WRB may serve as a driver enable for an internal single-ended driver (not shown) and an internal low voltage differential driver (not shown). The signal WRB may be in the logical LOW state to enable the internal drivers and the logical HIGH state to disable the internal drivers. The signal WRB may serve as the signal EN of FIG. 2.

The signal LVD may serve as a low voltage differential (LVD)/single-ended (SE) mode select signal. The pad circuit 112A may present the signal DATA as a low voltage differential signal when the signal LVD is in the logical HIGH state (an LVD mode). The pad circuit 112A may present the signal DATA as a single-ended signal when the signal LVD is in the logical LOW state (an SE mode).

The signal ANE may serve as an active negation enable/disable signal. When the signal ANE is in the logical HIGH state, the pad circuit 112A may provide active negation. When the signal ANE is in the logical LOW state, the pad circuit 112A may provide passive negation. The active and the passive negation are generally supported only for the SE mode.

The signal ISI may serve as an inter-symbol interference (ISI) compensation enable/disable signal. The signal IBIAS may serve as a bias input current signal. The signal SL33 may serve as a slew rate control signal for both the LVD mode and the SE mode. The signal SP33 may serve as a drive strength control signal for an LVD primary circuit (not shown) within the pad circuit 112A. The signal SS33 may serve as a drive strength control signal for an LVD secondary circuit (not shown) within the pad circuit 112A. The signal Z may serve as the signal DATA when the pad circuit 112B receives data through input/output (I/O) pads 140A–B. The signal PI may serve as a logical NAND tree (not shown) input signal. The signal PO may serve as the logical NAND tree output signal.

The signal RDB may serve as a receiver enable signal. The signal RDB may disable receiving data at the I/O pads 140A–B when in the logical HIGH state. The signal RDB may enable receiving data at the I/O pads 140A–B when in the logical LOW state.

The signal HTPLG may serve as a driver disable control signal. The signal HTPLG may be non-buffered from a power-on reset. The signal HTPLG may be in the logical LOW state to cause normal driver operation. The signal HTPLG may be in the logical HIGH state to disable driver operation.

The signal IDDTN may serve as a disable control signal. The signal IDDTN may be in the logical HIGH state to cause normal operation. The signal IDDTN may be in the logical LOW state to cause the pad circuit 112B to enter a low power mode with all internal circuits disabled.

The signal ME may serve as a secondary driver enable/disable signal. The signal ME may be in the logical HIGH state to enable an internal secondary driver (not shown). The signal ME may be in the logical LOW state to disable the internal secondary driver.

The signal PADM may serve as a single-ended data output signal and as a low voltage differential negative output signal. The signal PADP may serve as a single-ended ground drive and a low voltage differential positive output signal. Together or individually the signals PDAM and PADP may serve as the signal DATA presented by the pad circuit 112 in FIG. 2. The signal PADI may be the signal PADM presented non-buffered. The signal GND may serve as ground at an I/O pad 142.

Referring to FIG. 4, a block diagram of a portion of another embodiment of a circuit 144 is shown. The circuit 144 may include an input type of pad circuit 112B. As before, the signal PCNT may be used to control characteristics of the pad circuit 112B. For example, the signal PCNT may be used to enable/disable active termination, control a noise margin threshold, enable/disable a de-bounce function, select between differential and single-ended type reception of the signal DATA, and the like. A signal generator 146 may be connected to the system input pins 102A–B to present the signal DATA to the pad circuit 112B. An analyzer 147 may be connected to the signal TDO to analyze the signal TEST.

Referring to FIG. 5, a flow diagram of a procedure for testing an output type pad circuit 112 is shown. The signal TCNT is generally produced in the user data register 138 to control the signals TCNT (e.g., block 148). The signal TCNT may be multiplexed with the signal CNT by the multiplexer 136 (e.g., block 150). The multiplexer 136 may select the signal TCNT as the signal PCNT presented to the pad circuits 112 (e.g., block 152).

The test circuit 122 may transfer the signal TEST to the B/S cells 110 to establish a desired test input condition for a selected pad circuit 112 (e.g., block 154). The B/S cells 110 may swap the signals DATA and TEST by overwriting the signal DATA with the signal TEST (e.g., block 156). The signal DATA, now identical to the signal TEST, may present the desired test input condition to the selected pad circuit 112 (e.g., block 158). The tester 123 may then measure a response of the selected pad circuit 112 to the desired test input condition (e.g., block 160).

Where the characteristic of the pad circuit 112 being tested is dynamic, such as a slew rate, then the procedure of FIG. 5 may be modified. For example, the B/S cell 110 has presented the signal DATA in the logical LOW state to the selected pad circuit 112 at block 158. The test circuit 122 may then clock the signal TEST to cause the B/S cell 110 associated with the selected pad circuit 112 to have the signal TEST in the logical HIGH state (e.g., following the dotted arrow from block 158 to block 154). The R/S cell 110 may overwrite the logical LOW state of the signal DATA with the logical HIGH state of the signal TEST (e.g., block 156). The B/S cell 110 may then present the signal DATA in the logical HIGH state to the selected pad circuit 112 (e.g., block 158). The tester 123 may then measure a transition (LOW to HIGH) response of the selected pad circuit 112 (e.g., block 160). Generally the signal EN may be wired as one of the signal PCNT to avoid changing state as the signal TEST is clocked.

Referring to FIG. 6, a flow diagram of a procedure for testing an input type pad circuit 112B is shown. The signal TCNT is generally produced in the user data register 138 to control the signals TCNT (e.g., block 162). The signal TCNT may be multiplexed with the signal CNT by the multiplexer 136 (e.g., block 164). The multiplexer 136 may select the signal TCNT as the signal PCNT as presented to the pad circuits 112 (e.g., block 166).

The signal generator 146 may present the signal DATA to the pad circuit 112B (e.g., block 168). The pad circuit 112B may respond by presenting the signal DATA to the B/S cell 110A (e.g., block 170). The B/S cell 110A may swap the signals TEST and DATA by overwriting the signal TEST with the signal DATA (e.g., block 172). The signal TEST, now equal to the signal DATA, may then be transferred from the B/S cell 110A to the test circuit 122 (e.g., block 174). From the test circuit 122, the signal TEST may be transferred to the analyzer 147 as the signal TDO (e.g., block 176). The analyzer 147 may measure the signal TEST to determine a response of the pad circuit 112B to the signal DATA (e.g., block 178).

Where the characteristic of the pad circuit 112B being tested is dynamic, then the procedure of FIG. 6 may be modified. The signal generator 146 may change the signal DATA presented to the pad circuit 112B once the B/S cell 110A has transferred the signal TEST (e.g., following the arrow from block 174 to block 168). The B/S cell 110A may then receive the changed signal DATA (e.g., block 170). The changed signal DATA may overwrite the signal TEST again (e.g., block 172). The signal TEST may be transferred to the test circuit 122 (e.g., block 164) and then to the analyzer 147 (e.g., block 176). The analyzer 147 may measure the signal TEST as a pair of samples captured from the pad circuit 112B as the signal DATA changed. Generally, the signal TEST may be clocked several times to form a sequence of samples within the signal TEST. From the sequence of samples, a transition response of the pad circuit 112B may be determined by the analyzer 147.

The various signals of the present invention are generally "on" (e.g., a digital HIGH, active, asserted, or 1) or "off" (e.g., a digital LOW, inactive, de-asserted, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
    a first pad circuit configured to transfer a first data signal in response to a pad control signal;
    a second pad circuit configured to generate a second data signal from an input signal in response to said pad control signal;
    a core logic configured to (i) exchange said first data signal with said first pad circuit, (ii) receive said second data signal and (iii) generate a control signal;
    a first cell configured to (i) transfer said first data signal between said first pad circuit and said core logic and (ii) swap said first data signal and a test signal;
    a second cell configured to (i) transfer said second data signal from said second pad circuit to said core logic and (ii) swap said second data signal and said test signal; and
    a test circuit configured to (i) exchange said test data signal with said first cell and said second cell, (ii) store a test control signal and (iii) multiplex said test control signal and said control signal to generate said pad control signal.

2. The circuit according to claim 1, wherein (i) said test circuit transfers said test data signal to said first cell and (ii) said first cell overwrites said first data signal with said test data signal for transfer to said first pad circuit.

3. The circuit according to claim 2, wherein said test circuit is further configured to clock said test data signal at a predetermined time to cause said first pad circuit to undergo a predetermined state transition for a transition response measurement of said first pad circuit.

4. The circuit according to claim 1, wherein (i) said second cell transfers said second data signal to said second cell and (ii) said second cell overwrites said test data signal with said second data signal for transfer to said test circuit.

5. The circuit according to claim 4, wherein said test circuit is further configured to clock said test data signal to receive a sequence of samples for said second data signal as said input signal undergoes a predetermined state transition for a transition response measurement of said second pad circuit.

6. The circuit according to claim 1, wherein said test circuit comprises:
a multiplexer configured to multiplex said control signal and said test control signal to generate said pad control signal; and
a controller configured to (i) store said test control signal, (ii) transfer said test control signal to said multiplexer, and (iii) exchange said test data signal with said first cell and said second cell.

7. The circuit according to claim 6, wherein said controller comprises:
an input configured to receive said test control signal; and
a user data register configured to (i) store said test control signal from said input and (ii) present said test control signal to said multiplexer.

8. The circuit according to claim 1, wherein said pad control signal comprises an enable signal configured to alternatively enable and disable an output drive capability of said first pad circuit.

9. The circuit according to claim 1, wherein said pad control signal comprises a receive enable signal configured to alternatively enable and disable a receive capability of said first pad circuit.

10. The circuit according to claim 1, wherein said pad control signal comprises a signal configured to alternatively enable and disable an active termination of said second pad circuit.

11. The circuit according to claim 1, wherein said pad control signal comprises a signal configured to control a noise margin threshold of said second pad circuit for said input signal.

12. The circuit according to claim 1, wherein said control signal comprises a plurality of signals and said multiplexer comprises a plurality of multiplexers, one for each of said signals.

13. The circuit according to claim 12, wherein at least one of said first pad circuit and said second pad circuit receives a subset of said signals.

14. A method of testing a pad circuit that transfers a data signal in response to a pad control signal, the method comprising the steps of:

(A) generating a test control signal by a test circuit;
(B) multiplexing said test control signal and a control signal generated by a core logic co-located with said test circuit to generate said pad control signal;
(C) configuring said pad circuit with information from said test control signal;
(D) swapping said data signal of said pad circuit and a test data signal of a cell after step (C); and
(E) measuring a response of said pad circuit based upon said test data signal.

15. The method according to claim 14, wherein step (D) comprises the sub-steps of:
transferring said test data signal to said cell;
first overwriting said data signal with said test data signal; and
first transferring said data signal to said pad circuit in response to said first overwriting.

16. The method according to claim 15, wherein step (D), further comprises the sub-steps of:
clocking said test data signal after said first transferring of said data signal to said pad circuit;
second overwriting said data signal with said test data signal; and
second transferring said data signal to said pad circuit in response to said second overwriting, wherein said response of said pad circuit comprises a transition response for driving an output signal.

17. The method according to claim 14, wherein step (D) comprises the sub-steps of:
first receiving said data signal at said cell;
first overwriting said test data signal with said data signal; and
first transferring said test data signal from said cell to said test circuit.

18. The method according to claim 17, wherein step (D) further comprises the sub-steps of:
second receiving said data signal;
second overwriting said test data signal with said data signal; and
second transferring said test data signal from said cell to said test circuit, wherein said response of said pad circuit comprises a transition response to an input signal.

19. A circuit comprising:
means for generating a test control signal;
means for multiplexing said test control signal and a control signal generated by a core logic co-located with said means for generating;
means for transferring a data signal, said means for transferring being configured with information from said test control signal;
means for swapping said data signal of said means for transferring and a test data signal of a cell after configuring said means for transferring;
means for measuring a response of said means for transferring based upon said test data signal.

20. The circuit according to claim 19, wherein said response for said means for transferring is a transition response between a high state and a low state.

* * * * *